(12) United States Patent
Yamamoto

(10) Patent No.: US 12,116,479 B2
(45) Date of Patent: Oct. 15, 2024

(54) SEALING RESIN COMPOSITION

(71) Applicant: SUMITOMO BAKELITE CO., LTD., Tokyo (JP)

(72) Inventor: Jun Yamamoto, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 18/562,020

(22) PCT Filed: May 20, 2022

(86) PCT No.: PCT/JP2022/020956
§ 371 (c)(1),
(2) Date: Nov. 17, 2023

(87) PCT Pub. No.: WO2022/249987
PCT Pub. Date: Dec. 1, 2022

(65) Prior Publication Data
US 2024/0240011 A1    Jul. 18, 2024

(30) Foreign Application Priority Data
May 28, 2021    (JP) ................................ 2021-089965

(51) Int. Cl.
| | |
|---|---|
| *C08L 63/04* | (2006.01) |
| *C08G 59/32* | (2006.01) |
| *C08G 59/62* | (2006.01) |
| *C08K 3/36* | (2006.01) |
| *C08L 51/04* | (2006.01) |
| *H01L 23/29* | (2006.01) |

(52) U.S. Cl.
CPC .............. *C08L 63/04* (2013.01); *C08G 59/32* (2013.01); *C08G 59/621* (2013.01); *C08K 3/36* (2013.01); *C08L 51/04* (2013.01); *H01L 23/295* (2013.01); *C08G 2190/00* (2013.01); *C08K 2201/014* (2013.01); *C08L 2203/206* (2013.01); *C08L 2205/22* (2013.01); *C08L 2207/53* (2013.01)

(58) Field of Classification Search
CPC ............. C08L 63/00–10; H01L 23/293; H01L 23/295
See application file for complete search history.

(56) References Cited

U.S. PATENT DOCUMENTS

| | | | | | |
|---|---|---|---|---|---|
| 4,902,732 | A | * | 2/1990 | Itoh .......................... | H01B 3/36 523/435 |
| 5,053,445 | A | * | 10/1991 | Itoh ........................ | C08G 77/42 525/487 |
| 5,068,267 | A | * | 11/1991 | Uchida .............. | C08G 59/3218 523/435 |
| 6,265,782 | B1 | * | 7/2001 | Yamamoto ........ | H01L 23/49816 257/782 |
| 2001/0049407 | A1 | * | 12/2001 | Otsuki ................... | C08K 5/523 524/127 |
| 2008/0088961 | A1 | * | 4/2008 | Kushida ............... | G03B 21/604 359/893 |
| 2019/0355638 | A1 | | 11/2019 | Tsutsumi et al. | |

FOREIGN PATENT DOCUMENTS

| | | | |
|---|---|---|---|
| CN | 106715580 A | 5/2017 | |
| CN | 110499025 A | 11/2019 | |
| JP | 2660012 B2 * | 10/1997 | ......... C08G 59/3218 |
| JP | 10-60085 A | 3/1998 | |
| JP | 2004-18803 A | 1/2004 | |
| JP | 2005-264037 A | 9/2005 | |
| JP | 2006243564 A * | 9/2006 | |
| JP | 2011-57734 A | 3/2011 | |
| JP | 2017-82027 A | 5/2017 | |
| JP | 2018-2923 A | 1/2018 | |
| JP | 2019-1937 A | 1/2019 | |
| JP | 2019-151691 A | 9/2019 | |
| KR | 910008562 B1 * | 10/1991 | |

OTHER PUBLICATIONS

Machine translation of KR 91-0008562 A (Year: 1991).*
Partial machine translation of JP-2006243564-A (Year: 2006).*
Decision to Grant a Patent issued in Japanese Patent Application No. 2022-566297, dated Nov. 22, 2022.
International Search Report (PCT/ISA/210) issued in PCT/JP2022/020956, dated Aug. 16, 2022.
Written Opinion of the International Searching Authority (PCT/ISA/237) issued in PCT/JP2022/020956, dated Aug. 16, 2022.
Chinese Office Action and Search Report for Chinese Application No. 202280038545.4, dated Mar. 3, 2024.
Extended European Search Report for European Application No. 22811257.9, dated Apr. 18, 2024.

* cited by examiner

*Primary Examiner* — Kregg T Brooks
(74) *Attorney, Agent, or Firm* — Birch, Stewart, Kolasch & Birch, LLP

(57) ABSTRACT

A sealing resin composition including an epoxy resin, a curing agent, an inorganic filler, and rubber particles, in which a toughness index of a cured product of the sealing resin composition at 25° C. is equal to or more than 80 and equal to or less than 100.

14 Claims, No Drawings

SEALING RESIN COMPOSITION

TECHNICAL FIELD

The present invention relates to a sealing resin composition which is used for sealing an electronic component.

BACKGROUND ART

As a method for sealing a semiconductor device, resin sealing using a thermosetting resin typified by an epoxy resin has been widely used. In particular, a resin composition including a polyfunctional epoxy resin, a novolac-type phenolic resin curing agent, and an inorganic filler as a main component has become a mainstream for sealing resins since the resin composition has excellent heat resistance, moldability, and electrical characteristics.

As one of the performances required for a sealing agent for a semiconductor device, stress relaxation inside the semiconductor device may be mentioned. Usually, in the semiconductor device, a chip including single-crystal silicon as a main component is bonded to a substrate including a metal or a plastic as a main component through a die bonding agent including an epoxy resin or the like as a main component. Further, these are protected with a sealing agent including an epoxy resin and an inorganic filler as a main component, and thus, a large stress due to the characteristics of those constituent members, that is, a difference in thermal expansion and elastic modulus occurs inside the sealing agent or at an interface between the sealing agent and a peripheral member. Therefore, it is required to absorb or dissipate such a stress for stress relaxation.

As one of units for the stress relaxation, there is a method of blending a silicone component in a resin composition. For example, Patent Document 1 describes a method for reducing a stress by using a predetermined polyfunctional phenol resin as a curing agent and adding silicone rubber particles.

RELATED DOCUMENT

Patent Document

[Patent Document 1] Japanese Laid-open patent publication No. 2005-264037

SUMMARY OF THE INVENTION

Technical Problem

However, the epoxy resin and the silicone rubber originally have poor compatibility, and for example, due to an external impact, defects tend to occur in a cured product, starting from an interface between the both. That is, although the elastic modulus of the cured product is reduced in proportion to the addition amount of silicone rubber particles, mechanical characteristics such as a bending strength may also be reduced.

Solution to Problem

The present invention has been made in view of the problems, and an object of the present invention is to provide a composition for sealing a semiconductor, which can achieve both a low elasticity and a high strength, and a method for producing the same.

According to the present invention, there is provided a sealing resin composition including:
an epoxy resin;
a curing agent;
an inorganic filler; and
rubber particles,
in which a toughness index of a cured product of the sealing resin composition at 25° C. is equal to or more than 80 and equal to or less than 100.

In addition, according to the present invention,
there is provided a method for producing the sealing resin composition, the method including:
a step of mixing an epoxy resin and rubber particles to obtain a masterbatch; and
a step of mixing the masterbatch, a curing agent, and an inorganic filler to obtain a resin composition.

Advantageous Effects of Invention

According to the present invention, there are provided a composition for sealing a semiconductor, which can achieve both a low elasticity and a high strength; and a method for producing the same.

DESCRIPTION OF EMBODIMENTS

Hereinafter, embodiments of the present invention will be described. Furthermore, in the present specification, unless otherwise specified, a notation "a to b" in the description of numerical ranges represents equal to or more than a and equal to or less than b. For example, "1% to 5% by mass" means "equal to or more than 1% by mass and equal to or less than 5% by mass".

In notation of groups (atomic groups) in the present specification, a notation without indicating whether it is substituted or unsubstituted includes both those having no substituent and those having a substituent. For example, an "alkyl group" includes not only an alkyl group having no substituent (unsubstituted alkyl groups) but also an alkyl group having a substituent (substituted alkyl groups).

A term "organic group" in the present specification means an atomic group obtained by removing one or more hydrogen atoms from an organic compound unless otherwise specified. For example, a "monovalent organic group" represents an atomic group obtained by removing one hydrogen atom from an optional organic compound.

[Sealing Resin Composition]

The sealing resin composition of the present embodiment (which may be referred to as a "resin composition" in the present specification) includes an epoxy resin (A), a curing agent (B), an inorganic filler (C), and rubber particles (D).

A toughness index of a cured product of the sealing resin composition of the present embodiment at 25° C. is equal to or more than 80 and equal to or less than 100.

The cured product thereof has a highly good balance between a low elasticity and a high strength by incorporating the components into the resin composition of the present embodiment. Here, the balance between the elastic modulus and the strength of the cured product of the resin composition can be confirmed using a value of the toughness index as an index.

In the present specification, the "toughness index" is defined as a value obtained by dividing a bending elastic modulus of the cured product at 25° C. by the value of a bending elastic modulus of the cured product at 25° C., and multiplying the resulting value by 10,000.

Toughness index=Bending elastic modulus/Bending strength×10,000

A resin composition having a toughness index of a cured product in the range of 80 to 100 has a low elasticity and a high strength, and thus, an electronic device obtained using the resin composition as a sealing material has excellent reliability. Furthermore, in the present embodiment, the bending elastic modulus at 25° C. refers to an elastic modulus measured at 25° C. in accordance with JIS 6911, and the bending strength at 25° C. refers to a strength measured at 25° C. in accordance with JIS 6911.

The toughness index of the resin composition of the present embodiment can be adjusted by selecting a type of the component (A), a blending amount thereof, and a method for producing the resin composition.

Hereinafter, each component used in the resin composition of the present embodiment will be described.

(Epoxy Resin (A))

The sealing resin composition of the present embodiment includes the epoxy resin (A).

As the epoxy resin, an entirety of monomers, oligomers, or polymers having two or more epoxy groups in one molecule (in other words, polyfunctional polymers) can be used in general.

As the epoxy resin, a non-halogenated epoxy resin is particularly preferable.

Examples of the epoxy resin (A) include biphenyl-type epoxy resins; bisphenol-type epoxy resins such as a bisphenol A-type epoxy resin, a bisphenol F-type epoxy resin, and a tetramethylbisphenol F-type epoxy resin; stilbene-type epoxy resins; novolac-type epoxy resins such as a phenol novolac-type epoxy resin and a cresol novolac-type epoxy resin; polyfunctional epoxy resins such as a triphenol methane-type epoxy resin and an alkyl modified triphenol methane-type epoxy resin; phenolaralkyl-type epoxy resins such as a phenolaralkyl-type epoxy resin having a phenylene skeleton and a phenolaralkyl-type epoxy resin having a biphenylene skeleton; naphthol-type epoxy resins such as a dihydroxynaphthalene-type epoxy resin and an epoxy resin obtained by glycidyl-etherification of a dimer of dihydroxynaphthalene; triazine nucleus-containing epoxy resins such as triglycidyl isocyanurate and monoallyl diglycidyl isocyanurate; and bridged cyclic hydrocarbon compound-modified phenol-type epoxy resins such as a dicyclopentadiene-modified phenol-type epoxy resin.

The epoxy resin (A) more preferably includes at least one of the bisphenol-type epoxy resin, the biphenyl-type epoxy resin, the novolac-type epoxy resin (for example, an o-cresol novolac epoxy resin), the phenolaralkyl-type epoxy resin, and the triphenol methane-type epoxy resin. In order to control the elastic modulus at a high temperature, the phenolaralkyl-type epoxy resin having a biphenylene skeleton is particularly preferable.

As the epoxy resin (A), for example, at least one selected from the group consisting of an epoxy resin represented by General Formula (1), an epoxy resin represented by General Formula (2), an epoxy resin represented by General Formula (3), an epoxy resin represented by General Formula (4), and an epoxy resin represented by General Formula (5) can be used. Among these, the epoxy resin represented by General Formula (1) and the epoxy resin represented by General Formula (4) may be mentioned as one of more preferred aspects.

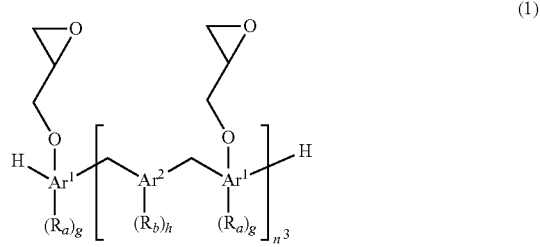

(1)

In General Formula (1), $Ar^1$ represents a phenylene group or a naphthylene group, and in a case where $Ar^1$ is the naphthylene group, a glycidyl ether group may be bonded to either the α-position or the β-position.

$Ar^2$ represents any one of a phenylene group, a biphenylene group, or a naphthylene group.

$R_a$ and $R_b$ each independently represent a hydrocarbon group having 1 to 10 carbon atoms.

g is an integer of 0 to 5 and h is an integer of 0 to 8. $n^3$ represents a degree of polymerization and an average value thereof is 1 to 3.

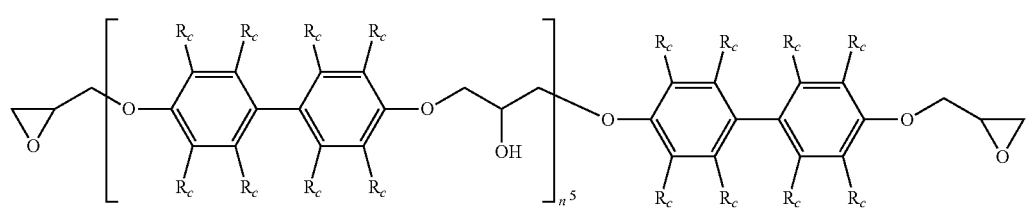

(2)

In General Formula (2), a plurality of Rc's each independently represent a hydrogen atom or a hydrocarbon group having 1 to 4 carbon atoms.

$n^5$ represents a degree of polymerization and an average value thereof is 0 to 4.

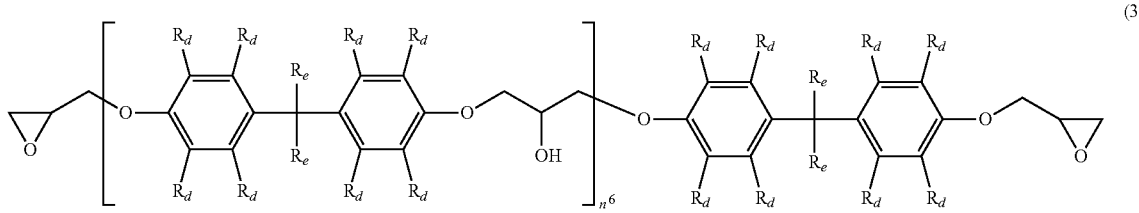
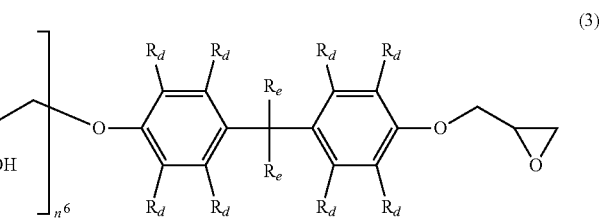

(3)

In General Formula (3),
a plurality of $R_d$'s and $R_e$'s each independently represent a hydrogen atom or a hydrocarbon group having 1 to 4 carbon atoms.
$n^6$ represents a degree of polymerization and an average value thereof is 0 to 4.

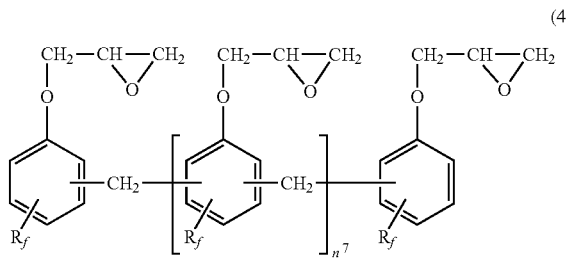

(4)

In General Formula (4),
a plurality of $R_f$'s each independently represent a hydrogen atom or a hydrocarbon group having 1 to 4 carbon atoms.
$n^7$ represents a degree of polymerization and an average value thereof is 0 to 4.

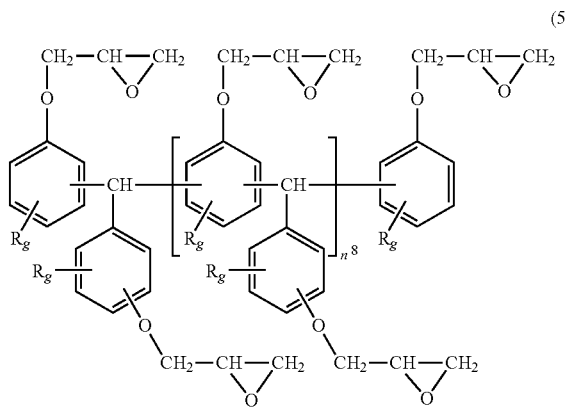

(5)

In General Formula (5),
a plurality of $R_g$'s each independently represent a hydrogen atom or a hydrocarbon group having 1 to 4 carbon atoms.
$n^8$ represents a degree of polymerization and an average value thereof is 0 to 4.

A number-average molecular weight of the epoxy resin (A) is not particularly limited, and may be appropriately selected from the viewpoints of fluidity, curability, and the like. As an example, the number-average molecular weight is about 100 to 700.

In addition, from the viewpoint of fluidity and the like, an ICI viscosity of the epoxy resin (A) at 150° C. is preferably 0.1 to 5.0 poise.

The sealing resin composition may include only one kind of the epoxy resin (A) or may include two or more kinds thereof.

An epoxy equivalent of the epoxy resin (A) is preferably 100 to 400 g/eq, and more preferably 150 to 350 g/eq. In a case where the sealing resin composition includes a plurality of epoxy resins (A), it is preferable that the epoxy equivalent as the entirety of the plurality of epoxy resins (A) is within a range of the numerical values.

The lower limit value of the amount of the epoxy resin (A) is, for example, preferably equal to or more than 3% by mass, more preferably equal to or more than 4% by mass, and particularly preferably equal to or more than 5% by mass with respect to an entirety of the sealing resin composition. By setting a content of the epoxy resin (A) to be within a range equal to or more than the lower limit value, the fluidity of the sealing resin composition can be improved and the moldability can be improved.

On the other hand, the upper limit value of the epoxy resin (A) amount is, for example, preferably equal to or less than 50% by mass, more preferably equal to or less than 30% by mass, and still more preferably equal to or less than 20% by mass with respect to the entirety of the sealing resin composition. By setting the content of the epoxy resin (A) to be within a range equal to or less than the upper limit value, moisture resistance reliability and reflow resistance of an electronic device such as a power device provided with a sealing material formed by the sealing resin composition can be improved.

A curing reaction in the composition is easily optimized by appropriately selecting the epoxy equivalent of the epoxy resin (A) or appropriately adjusting the amount of the epoxy resin (A) in the sealing resin composition. In addition, by appropriately adjusting the epoxy equivalent or the amount of the epoxy resin, the curing and flowing characteristics, and the like of the composition can be appropriately adjusted.

(Curing Agent (B))

The sealing resin composition of the present embodiment includes a curing agent (B).

The curing agent (B) is not particularly limited as long as it can react with the epoxy resin (A). Examples thereof include a phenol-based curing agent, an amine-based curing agent, an acid anhydride-based curing agent, and a mercaptan-based curing agent.

Among these, the phenol-based curing agent is preferable from the viewpoint of a balance among flame resistance, moisture resistance, electrical characteristics, curability, storage stability, and the like.

Phenol-Based Curing Agent

The phenol-based curing agent is not particularly limited as long as the agent is generally used in the sealing resin composition. Examples thereof include novolac resins obtained by the condensation or co-condensation of phenols such as phenol, cresol, resorcin, catechol, bisphenol A, bisphenol F, phenylphenol, aminophenol, α-naphthol, β-naphthol, and dihydroxynaphthalene with formaldehydes or ketones in the presence of an acidic catalyst, the novolac resins encompassing a phenol novolac resin and a cresol novolac resin; phenolaralkyl resins such as a phenolaralkyl resin having a phenylene skeleton, synthesized from the phenols and dimethoxyparaxylene or bis (methoxymethyl) biphenyl, and a phenolaralkyl resin having a biphenylene skeleton; and phenol resins having a trisphenylmethane skeleton. These may be used alone or in combination of two or more kinds thereof.

Amine-Based Curing Agent

Examples of the amine-based curing agent include polyamine compounds including dicyandiamide (DICY), an organic acid dihydrazide, or the like, in addition to aliphatic polyamines such as diethylenetriamine (DETA), triethylenetetramine (TETA), and metaxylylene diamine (MXDA), and aromatic polyamines such as diaminodiphenylmethane (DDM), m-phenylenediamine (MPDA), and diaminodiphenylsulfone (DDS). These may be used alone or in combination of two or more kinds thereof.

Acid Anhydride-Based Curing Agent

Examples of the acid anhydride-based curing agent include alicyclic acid anhydrides such as hexahydrophthalic anhydride (HHPA), methyltetrahydrophthalic anhydride (MTHPA), and maleic anhydride, and aromatic acid anhydrides such as trimellitic anhydride (TMA), pyromellitic anhydride (PMDA), benzophenonetetracarboxylic dianhydride (BTDA), and phthalic anhydride. These may be used alone or in combination of two or more kinds thereof.

Mercaptan-Based Curing Agent

Examples of the mercaptan-based curing agent include trimethylolpropane tris(3-mercaptobutyrate) and trimethylol ethane tris(3-mercaptobutyrate). These may be used alone or in combination of two or more kinds thereof.

Other Curing Agents

Examples of other curing agents include isocyanate compounds such as an isocyanate prepolymer and a blocked isocyanate, and organic acids such as a carboxylic acid-containing polyester resin. These may be used alone or in combination of two or more kinds thereof.

As the curing agent (B), two or more different kinds thereof may be used in combination. For example, the present embodiment also includes a use of the phenol-based curing agent and the amine-based curing agent in combination.

The amount of the curing agent (B) is, for example, preferably equal to or more than 0.5% by mass, more preferably equal to or more than 1% by mass, and particularly preferably equal to or more than 1.5% by mass with respect to the entirety of the sealing resin composition.

On the other hand, the content of the curing agent (B) is preferably equal to or less than 9% by mass, more preferably equal to or less than 8% by mass, and particularly preferably equal to or less than 7% by mass with respect to the entirety of the sealing resin composition.

By appropriately adjusting the amount of the curing agent (B), the curing and flowing characteristics or the like of the composition can be appropriately adjusted.

From another viewpoint, it is preferable that the amount of the curing agent (B) is appropriately adjusted in relation to the amount of the epoxy resin (A). Specifically, it is preferable that the so-called "molar equivalent" (molar ratio of reactive groups) is appropriately adjusted.

For example, in a case where the curing agent (B) is a phenol-based curing agent, the amount of the epoxy resin (A) with respect to the phenol-based curing agent is preferably 0.9 to 1.5, more preferably 1.0 to 1.4, still more preferably 1.0 to 1.3, and particularly preferably 1.01 to 1.20 in terms of the molar equivalent of the functional group (epoxy group/hydroxy group).

(Inorganic Filler (C))

The sealing resin composition of the present embodiment includes an inorganic filler (C).

Specific examples of the inorganic filler (C) include silica, alumina, titanium white, aluminum hydroxide, magnesium hydroxide, zinc borate, and silicon nitride.

Silica is preferable as the inorganic filler (C). Examples of silica include fused and crushed silica, fused spherical silica, crystalline silica, fine powder silica, and secondary aggregated silica. Among these, fused spherical silica is particularly preferable.

The inorganic filler (C) is usually particles. The shapes of the particles are preferably substantially spherical.

The average particle diameter of the inorganic filler (C) is not particularly limited, but is typically 1 to 100 μm, preferably 1 to 50 μm, and more preferably 1 to 20 μm. By setting the average particle diameter appropriately, it is possible to secure an appropriate fluidity during the curing.

The average particle diameter of the inorganic filler (C) can be determined by acquiring volume-based particle size distribution data using a laser diffraction/scattering particle size distribution analyzer (for example, LA-950 of a wet-type particle size distribution measuring apparatus manufactured by HORIBA, Ltd.), and processing the data. The measurement is usually performed by a dry method.

The inorganic filler (C) such as silica may be surface-modified with a coupling agent such as a silane coupling agent (before mixing all components to prepare a sealing resin composition) in advance.

As a result, the aggregation of the inorganic filler (C) is suppressed and a better fluidity can be obtained. In addition, the affinity between the inorganic filler (C) and other components is enhanced, and the dispersibility of the inorganic filler (C) is improved. This is considered to contribute to, for example, the improvement of the mechanical strength of the cured product and the suppression of the occurrence of microcracks.

As the coupling agent used for a surface treatment of the inorganic filler (C), examples of a coupling agent (E) which will be described later can be used. Among these, aminosilanes such as γ-aminopropyltriethoxysilane and γ-aminopropyltrimethoxysilane can be preferably used.

The dispersibility of the inorganic filler (C) in the sealing resin composition can be enhanced by modifying the surface of the inorganic filler (C) with a group (an amino group or the like) capable of reacting with the epoxy resin (A).

In addition, the fluidity, the strength after curing, and the like of the sealing resin composition can be controlled by appropriately selecting a kind of the coupling agent used for the surface treatment of the inorganic filler (C) or appropriately adjusting the blending amount of the coupling agent.

The surface treatment of the inorganic filler (C) with the coupling agent can be performed, for example, as follows.

First, the inorganic filler (C) and the coupling agent are mixed and stirred using a mixer. As a known mixer, for example, a ribbon mixer can be used for mixing and stirring. As a method of operating a mixer, (i) the inorganic filler (C) and the coupling agent may be charged in the mixer in advance and then blades may be rotated, or (ii) first, only the inorganic filler (C) may be charged while rotating the blades and then the coupling agent may be added little by little into the mixer with a spray nozzle or the like.

During the mixing and stirring, it is preferable to maintain a low humidity inside the mixer low (for example, a humidity of equal to or less than 50%). By setting the humidity to be low, it is possible to suppress the adhesion of water to the surface of the inorganic filler (C). Furthermore, it is possible to suppress the coupling agents from being mixed with water and reacting with each other.

Subsequently, the obtained mixture is taken out from the mixer and subjected to an aging treatment to accelerate a coupling reaction. The aging treatment is carried out by, for example, leaving the mixture to stand for one day or longer (preferably 1 to 7 days) under the conditions of 20° C.±5° C. and 40% to 50% RH. By carrying out the aging treatment under such conditions, the coupling agent can be uniformly bonded to the surface of the inorganic filler (C).

The surface-treated (coupling treatment) inorganic filler (C) is obtained by removing coarse particles through sieving after the aging treatment.

The sealing resin composition may include only one kind of the inorganic filler (C) or may include two or more kinds thereof.

The lower limit value of a content of the inorganic filler (C) is, for example, preferably equal to or more than 50% by mass, more preferably equal to or more than 60% by mass, and still more preferably equal to or more than 65% by mass with respect to the entirety of the sealing resin composition.

The upper limit value of the content of the inorganic filler (C) is, for example, preferably equal to or less than 95% by mass, more preferably equal to or less than 93% by mass, and still more preferably equal to or less than 90% by mass.

By appropriately adjusting the amount of the inorganic filler (C), the curing and flowing characteristics, and the like of the resin composition can be appropriately adjusted.

(Rubber Particles (D))

The sealing resin composition of the present embodiment includes rubber particles (D). The resin composition including the rubber particles (D) has a high strength and a low elastic modulus, and thus has a high toughness. As the rubber particles, core-shell-type rubber particles are preferably used due to their excellent reinforcing effect.

The core-shell-type rubber particles refer to rubber particles coated with a shell component over a part or all of the surface of a particulate core component by graft-polymerizing a polymer different from the core component over the surface of the particulate core component including a crosslinked rubber-like polymer as a main component.

Examples of the core component include crosslinked rubber particles. Examples of the crosslinked rubber particles include a diene-based rubber, an acrylic rubber, and a polysiloxane-based rubber. More specific examples thereof include a butadiene rubber, an acrylic rubber, a silicone rubber, a butyl rubber, a nitrile rubber, a styrene rubber, a synthetic natural rubber, and an ethylene propylene rubber.

Examples of the shell component include a diene-based rubber, an acrylic rubber, and a polysiloxane-based rubber. Preferred examples thereof include a polymer obtained by polymerizing one monomer or a plurality of monomers selected from the group consisting of an acrylic acid ester, a methacrylic acid ester, and an aromatic vinyl compound. Furthermore, the shell component is preferably graft-polymerized over the core component and chemically bonded to a polymer forming the core component. Incidentally, in a case where a crosslinked rubber-like polymer formed of a polymer of styrene and butadiene is used as the core component, methyl methacrylate, which is a methacrylic acid ester, and the polymer of styrene, which is an aromatic vinyl compound, are preferably used as the shell component.

Examples of commercially available products of the core-shell-type rubber particles include "PARALOID (registered trademark)" EXL-2655 (manufactured by Kureha Corporation) formed of a copolymer of butadiene, alkyl methacrylate, and styrene, STAFILOID (registered trademark) AC-3355 and TR-2122 (manufactured by Ganz Chemical Co., Ltd.) formed of a copolymer of an acrylic acid ester and a methacrylic acid ester, "PARALOID (registered trademark)" EXL-2611 and EXL-3387 (manufactured by Rohm & Haas Co., Ltd.) formed of a copolymer of butyl acrylate and methyl methacrylate, and "KANE ACE (registered trademark)" MX Series (manufactured by Kaneka Corporation).

From the viewpoint that a resin composition capable of forming a cured product having a high strength and a low elastic modulus can be obtained, the content of the rubber particles (D) is preferably equal to or more than 0.1% by mass, and more equal to or more than 0.5% by mass with respect to with respect to the entirety of the sealing resin composition. The upper limit value of the content of the rubber particles is preferably equal to or less than 10% by mass, and more preferably equal to or less than 5% by mass.

In addition, from the viewpoint that a resin composition capable of forming a cured product having a high strength and a low elastic modulus can be obtained, the average particle diameter of the primary particles of the rubber particles (D) is preferably in the range of 50 to 500 nm, and more preferably in the range of 50 to 300 nm.

(Coupling Agent (E))

The sealing resin composition of the present embodiment preferably includes a coupling agent (E). Furthermore, the coupling agent (E) is included in the sealing resin composition as a simple substance of the coupling agent (E). For example, the coupling agent (bonded with the inorganic filler (C)) used for the surface treatment of the inorganic filler (C) described above does not correspond to the coupling agent (E) as used herein.

As the coupling agent (E), known coupling agents, for example, various silane-based compounds such as epoxysilane, mercaptosilane, aminosilane, alkylsilane, ureidosilane, vinylsilane, and methacrylsilane, titanium-based compounds, aluminum chelates, and aluminum/zirconium-based compounds can be used.

More specifically, the following coupling agents can be exemplified.

Silane-Based Coupling Agent

Vinyltrichlorosilane, vinyltrimethoxysilane, vinyltriethoxysilane, vinyltris(β-methoxyethoxy)silane, γ-methacryloxypropyltrimethoxysilane, Q-(3,4-epoxycyclohexyl)ethyltrimethoxysilane, γ-glycidoxypropyltrimethoxysilane, γ-glycidoxypropyltriethoxysilane, γ-glycidoxypropyl methyldimethoxysilane, γ-methacryloxypropylmethyldiethoxysilane, γ-methacryloxypropyltriethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, phenylaminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N- vinylbenzylaminoethyl)-γ-Aminopropyltrimethoxysilane, γ-chloropropyltrimethoxysilane, hexamethyldisilane, vinyltrimethoxysilane, γ-mercaptopropylmethyldimethoxysilane, 3-isocyanatepropyltriethoxysilane, 3-acryloxypropyltrimethoxysilane, a hydrolysate of 3-triethoxysilyl-N-(1,3-dimethyl-butylidene)propylamine, and the like.

Titanate-Based Coupling Agent

Isopropyltriisostearoyl titanate, isopropyltris(dioctylpyrophosphate)titanate, isopropyltri(N-aminoethyl-aminoethyl) titanate, tetraoctylbis(ditridecylphosphite)titanate, tetra(2,2-diallyloxymethyl-1-butyl)bis(ditridecyl)phosphite titanate, bis(dioctylpyrophosphate)oxyacetate titanate, bis(dioctylpyrophosphate)ethylene titanate, isopropyltrioctanoyl titanate, isopropyldimethacrylic isostearoyl titanate, isopropyltridodecylbenzenesulfonyl titanate, isopropylisostearoyl diacrylic titanate, isopropyltri(dioctyl phosphate)titanate, isopropyl tricumylphenyl titanate, tetraisopropylbis(dioctyl phosphite)titanate, and the like.

In a case where the sealing resin composition includes the coupling agent (E), the sealing resin composition may include only one kind of coupling agent (E), or may include two or more kinds of coupling agents (E).

The content of the coupling agent (E) is preferably equal to or more than 0.1% by mass, and more preferably equal to or more than 0.15% by mass with respect to the entirety of the sealing resin composition. By setting the content of the coupling agent (E) to equal to or more than the lower limit value, the dispersibility of the inorganic filler can be improved.

On the other hand, the content of the coupling agent (E) is preferably equal to or less than 1, by mass, and more preferably equal to or less than 0.5% by mass with respect to the entirety of the sealing resin composition. By setting the content of the coupling agent (E) to equal to or less than the upper limit value, the fluidity of the sealing resin composition during the sealing molding can be improved, and the fillability or the moldability can be improved.

(Curing Accelerator (F))

In one embodiment, the sealing resin composition may include a curing accelerator (F). The curing accelerator (F) may be any one that promotes a reaction (typically a crosslinking reaction) between the epoxy resin (A) and the curing agent (B).

Examples of the curing accelerator (F) include one or two or more selected from phosphorus atom-containing compounds such as an organic phosphine, a tetra-substituted phosphonium compound, a phosphobetaine compound, an adduct of a phosphine compound and a quinone compound, and an adduct of a phosphonium compound and a silane compound; and nitrogen atom-containing compounds such as amidines or tertiary amines such as 1,8-diarabicyclo [5.4.0]-7-undecene, benzyldimethylamine, and 2-methylimidazole, and quaternary salts of the amidines or the amines.

Among these, from the viewpoint of improving the curability of the resin composition, it is more preferable to include a phosphorus atom-containing compound. In addition, from the viewpoint of improving a balance between the moldability and the curability, it is more preferable to include a compound having a latent property, such as a tetra-substituted phosphonium compound, a phosphobetaine compound, an adduct of a phosphine compound and a quinone compound, and an adduct of a phosphonium compound and a silane compound.

Examples of the organic phosphine include primary phosphines such as ethylphosphine and phenylphosphine; secondary phosphines such as dimethylphosphine and diphenylphosphine; and tertiary phosphines such as trimethylphosphine, triethylphosphine, tributylphosphine, and triphenylphosphine.

Examples of the tetra-substituted phosphonium compound include a compound represented by General Formula (6).

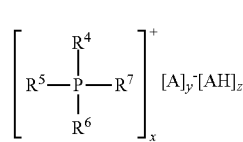

In General Formula (6),

P represents a phosphorus atom.

$R^4$, $R^5$, $R^6$, and $R^7$ each independently represent an aromatic group or an alkyl group.

A represents an anion of an aromatic organic acid having at least one unit of any one functional group selected from a hydroxyl group, a carboxyl group, and a thiol group in the aromatic ring.

AH represents an aromatic organic acid having at least one unit of any one functional group selected from a hydroxyl group, a carboxyl group, and a thiol group in the aromatic ring.

x and y are each a number of 1 to 3 and z is a number of 0 to 3, with x=y.

The compound represented by General Formula (6) can be obtained, for example, as follows.

First, a tetra-substituted phosphonium halide, an aromatic organic acid, and a base are mixed with an organic solvent, the mixture is uniformly mixed, and an aromatic organic acid anion is generated in the solution system. Subsequently, water is added to the solution, and thus, the compound represented by General Formula (6) can be precipitated. In the compound represented by General Formula (6), $R^4$, $R^5$, $R^6$, and $R^7$, all of which are bonded to a phosphorus atom, are each preferably a phenyl group, AH is preferably a compound in which a hydroxyl group is bonded to an aromatic ring, that is, phenols, and A is preferably an anion of the phenols. Examples of the phenols include monocyclic phenols such as phenol, cresol, resorcin, and catechol; fused polycyclic phenols such as naphthol, dihydroxynaphthalene, and anthraquinol; bisphenols such as bisphenol A, bisphenol F, and bisphenol S; and polycyclic phenols such as phenylphenol and biphenol.

Examples of the phosphobetaine compound include a compound represented by General Formula (7).

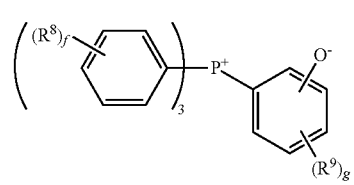

In General Formula (7),

P represents a phosphorus atom.

$R^8$ represents an alkyl group having 1 to 3 carbon atoms and $R^9$ represents a hydroxyl group.

f is a number of 0 to 5 and g is a number of 0 to 3.

The compound represented by General Formula (7) can be obtained, for example, as follows.

The compound is obtained through a step of first bringing a triaromatic-substituted phosphine, which is a tertiary phosphine, into contact with a diazonium salt, and substituting the triaromatic-substituted phosphine with a diazonium group of the diazonium salt.

Examples of the adduct of a phosphine compound and a quinone compound include a compound represented by General Formula (8).

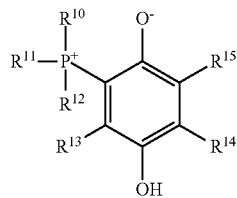

(8)

In General Formula (8),

P represents a phosphorus atom.

$R^{10}$, $R^{11}$, and $R^{12}$ each represent an alkyl group having 1 to 12 carbon atoms or an aryl group having 6 to 12 carbon atoms, and may be the same as or different from each other.

$R^{13}$, $R^{14}$, and $R^{15}$ each represent a hydrogen atom or a hydrocarbon group having 1 to 12 carbon atoms and may be the same as or different from each other, or $R^{14}$ and $R^{15}$ may be bonded to form a cyclic structure.

With regard to the phosphine compound that is used for the adduct of a phosphine compound and a quinone compound, for example, a compound in which the aromatic ring is unsubstituted or has a substituent such as an alkyl group or an alkoxyl group present in the aromatic ring, such as triphenylphosphine, a tris(alkylphenyl)phosphine, a tris(alkoxyphenyl)phosphine, trinaphthylphosphine, or tris(benzyl)phosphine, is preferred, and the substituent such as an alkyl group or an alkoxyl group include those having 1 to 6 carbon atoms. Triphenylphosphine is preferred from the viewpoint of easy availability.

In addition, examples of the quinone compound that is used for the adduct of a phosphine compound and a quinone compound include benzoquinone and anthraquinones, and among these, p-benzoquinone is preferred from the viewpoint of storage stability.

With regard to a method for producing the adduct of a phosphine compound and a quinone compound, the adduct can be obtained by bringing an organic tertiary phosphine and a benzoquinone into contact with each other in a solvent in which both the compounds can be dissolved, and mixing the compounds. The solvent may be the ketones such as acetone and methyl ethyl ketone, having a low dissolvability for the adduct. However, the solvent is not limited thereto.

The compound represented by General Formula (8), in which $R^{10}$, $R^{11}$, and $R^{12}$ bonded to a phosphorus atom are each preferably a phenyl group, and $R^{13}$, $R^{14}$, and $R^{15}$ are each preferably a hydrogen atom, that is, a compound produced by adding 1,4-benzoquinone to triphenylphosphine is preferable from the viewpoint that the compound decreases the elastic modulus during heating of a cured product of the sealing resin composition.

Examples of the adduct of a phosphonium compound and a silane compound include a compound represented by General Formula (9).

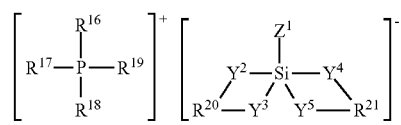

(9)

In General Formula (9),

P represents a phosphorus atom and Si represents a silicon atom.

$R^{16}$, $R^{17}$, $R^{18}$, and $R^{19}$ each represent an organic group having an aromatic ring or a heterocyclic ring, or an aliphatic group, and may be the same as or different from each other.

$R^{20}$ is an organic group which is bonded to groups $Y^2$ and $Y^3$.

$R^{21}$ is an organic group which is bonded to groups $Y^4$ and $Y^5$.

$Y^2$ and $Y^3$ each represent a group formed in a case where a proton-donating group releases a proton, in which the groups $Y^2$ and $Y^3$ in the same molecule are bonded to a silicon atom to form a chelate structure.

$Y^4$ and $Y^5$ each represent a group formed in a case where a proton-donating group releases a proton, in which the groups $Y^4$ and $Y^5$ in the same molecule are bonded to a silicon atom to form a chelate structure.

$R^{20}$ and $R^{21}$ may be the same as or different from each other, and the groups $Y^2$, $Y^3$, $Y^4$, and $Y^5$ may be the same as or different from each other.

$Z^1$ is an organic group having an aromatic ring or a heterocyclic ring, or an aliphatic group.

In General Formula (9), examples of $R^{16}$, $R^{17}$, $R^{18}$, and $R^{19}$ include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, and a cyclohexyl group, and among these, aromatic groups having a substituent such as an alkyl group, an alkoxy group, and a hydroxyl group, and unsubstituted aromatic groups, such as a phenyl group, a methylphenyl group, a methoxyphenyl group, a hydroxyphenyl group, and a hydroxynaphthyl group, or unsubstituted aromatic groups are more preferable.

In General Formula (9), $R^{20}$ is an organic group which is bonded to $Y^2$ and $Y^3$. Similarly, $R^{21}$ is an organic group which is bonded to groups $Y^4$ and $Y^5$. $Y^2$ and $Y^3$ are each a group formed in a case where a proton-donating group releases a proton, in which the groups $Y^2$ and $Y^3$ in the same molecule are bonded to a silicon atom to form a chelate structure. Similarly, $Y^4$ and $Y^5$ are each a group formed in a case where a proton-donating group releases a proton, in which the groups $Y^4$ and $Y^5$ in the same molecule are bonded to a silicon atom to form a chelate structure. The groups $R^{20}$ and $R^{21}$ may be the same as or different from each other, and the groups $Y^2$, $Y^3$, $Y^4$, and $Y^5$ may be the same as or different from each other. The groups represented by —$Y^2$—$R^{20}$—$Y^3$— and $Y^4$—$R^{21}$—$Y^5$— in General Formula (9) are each a group formed in a case where a proton donor releases two protons. As the proton donor, an organic acid having at least two carboxyl groups or hydroxyl groups in the molecule is preferable, an aromatic compound having at least two carboxyl groups or hydroxyl groups in the adjacent carbons constituting the aromatic ring is even more preferable, and an aromatic compound having at least two hydroxyl groups in the adjacent carbons constituting the aromatic ring is more preferable. Examples thereof include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, and glycerin, but among these, catechol, 1,2-dihydroxynaphthalene, and 2,3-dihydroxynaphthalene are more preferable.

$Z^1$ in General Formula (9) is an organic group having an aromatic ring or a heterocyclic ring, or an aliphatic group. Specific examples thereof include aliphatic hydrocarbon groups such as a methyl group, an ethyl group, a propyl group, a butyl group, a hexyl group, and an octyl group, aromatic hydrocarbon groups such as a phenyl group, a benzyl group, a naphthyl group, and a biphenyl group, and reactive substituents such as an alkyl group having a glicydyloxy group, a mercapto group, or an amino group, such as a glycidyloxypropyl group, a mercaptopropyl group, and an aminopropyl group, and a vinyl group, but among these, the methyl group, the ethyl group, the phenyl group, the naphthyl group, and the biphenyl group are more preferable in view of thermal stability.

A method for producing the adduct of a phosphonium compound and a silane compound is as follows.

A silane compound such as phenyltrimethoxysilane and a proton donor such as 2,3-dihydroxynaphthalene are added to methanol in a flask, and dissolved, and a sodium methoxide-methanol solution is added dropwise thereto under stirring at room temperature. In a case where a solution prepared in advance, in which a tetra-substituted phosphonium halide such as tetraphenylphosphonium bromide is dissolved in methanol, is further added dropwise thereto while being stirred at room temperature, crystals are precipitated. In a case where the precipitated crystals are filtered, washed with water, and vacuum-dried, the adduct of a phosphonium compound and a silane compound is obtained.

The sealing resin composition may include only one kind of the curing accelerator (F) or may include two or more kinds thereof.

The content of the curing accelerator (F) is preferably equal to or more than 0.01% by mass, more preferably equal to or more than 0.05% by mass, and still more preferably equal to or more than 0.10% by mass with respect to the entirety of the sealing resin composition.

On the other hand, the content of the curing accelerator (F) is preferably equal to or less than 2.0% s by mass, more preferably equal to or less than 1.5% by mass, and still more preferably equal to or less than 1.0% by mass with respect to the entirety of the sealing resin composition.

By appropriately adjusting the amount of the curing accelerator (F), the curing and flowing characteristics, and the like of the resin composition can be appropriately adjusted.

(Other Components)

The sealing resin composition of the present embodiment may further include various additives such as an ion scavenger, a flame retardant, a colorant, a mold release agent, a low stress agent, an antioxidant, and a heavy metal inactivating agent, as necessary.

As the ion scavenger (also called an ion catcher, an ion trap agent, or the like), for example, hydrotalcite can be used. In addition, bismuth oxide, yttrium oxide, and the like are also known as the ion scavenger.

In a case where the ion scavenger is used, only one kind may be used, or two or more kinds thereof may be used in combination.

In the case where the ion scavenger is used, a content thereof is, for example, 0.01% to 0.5% by mass, and preferably 0.05% to 0.3% by mass with respect to the entirety of the sealing resin composition.

Examples of the flame-retardant can include inorganic flame retardants (for example, hydrated metal-based compounds such as aluminum hydroxide, available from Sumitomo Chemical Co., Ltd., and the like), halogen-based flame retardants, phosphorus-based flame retardants, and organic metal salt-based flame retardants.

In a case where the flame retardant is used, only one kind may be used, or two or more kinds thereof may be used in combination.

The amount of the flame-retardant is, for example, 0% to 15% by mass, and preferably 0% to 10% by mass with respect to the entirety of the sealing resin composition.

Specific examples of the colorant include carbon black, red iron oxide, and titanium oxide.

In a case where the colorant is used, only one kind may be used, or two or more kinds thereof may be used in combination.

In the case where the colorant is used, the amount thereof is, for example, 0.1% to 0.8% s by mass, and preferably 0.2% to 0.5% by mass with respect to the entirety of the sealing resin composition.

Examples of the mold release agent include natural waxes, synthetic waxes such as a montanic acid ester, a higher fatty acid or a metal salt thereof, paraffin, and polyethylene oxide.

In a case where the mold release agent is used, only one kind may be used, or two or more kinds thereof may be used in combination.

In the case where the mold release agent is used, the amount thereof is, for example, 0.1 to 0.8V by mass, and preferably 0.2 to 0.5% by mass with respect to the entirety of the sealing resin composition.

Examples of the low stress agent include silicone oil, silicone rubber, polyisoprene, polybutadiene such as 1,2-polybutadiene and 1,4-polybutadiene, styrene-butadiene rubber, acrylonitrile-butadiene rubber, polychloroprene, poly(oxypropylene), poly (oxytetramethylene)glycol, polyolefin glycol, thermoplastic elastomers such as poly-ε-caprolactone, polysulfide rubber, and fluororubber.

Among these, silicone rubber, silicone oil, acrylonitrile-butadiene rubber, and the like are particularly preferable from the viewpoint of controlling a bending elastic modulus and a shrinkage rate within desired ranges and suppressing a warpage of a power device thus obtained.

In a case where the low stress agent is used, only one kind may be used, or two or more kinds thereof may be used in combination.

The amount of the low stress agent is, for example, 0% to 5% by mass, and preferably 0% to 3% by mass with respect to the entirety of the sealing resin composition.

Examples of the antioxidant include phenol-based antioxidants (dibutylhydroxytoluene and the like), sulfur-based antioxidants (mercaptopropionic acid derivative and the like), and phosphorus-based antioxidants (9,10-dihydro-9-oxa-10-phosphaphenanthren-10-oxide and the like).

In a case where the antioxidant is used, only one kind may be used, or two or more kinds thereof may be used in combination.

In the case where the antioxidant is used, an amount thereof is, for example, 0, to 3% by mass, and preferably 0% to 2% by mass with respect to the entirety of the sealing resin composition.

Examples of the heavy metal inactivating agent include ADEKA STAB CDA series (manufactured by ADEKA Corporation).

In a case where the heavy metal inactivating agent is used, only one kind may be used, or two or more kinds thereof may be used in combination.

The amount of the heavy metal inactivating agent is, for example, 0% to 1% by mass, and preferably 0% to 0.5% by mass with respect to the entirety of the sealing resin composition.

[Method for Producing Sealing Resin Composition]

As described above, in the sealing resin composition of the present embodiment, in order to set the toughness index of a cured product at 25° C. to be in the range equal to or more than 80 and equal to or less than 100, a method for producing the sealing resin composition (preparation method) is very important.

For example, a sealing resin composition can be obtained by mixing each of the above-mentioned components by a known mixer or the like, melt-kneading the mixture by a kneading machine such as a roll, a kneader, or an extruder, and cooling and pulverizing the mixture.

The shape of the sealing resin composition can be powder or granules as pulverized, a tablet shape formed by tableting after pulverizing, a shape obtained by sieving the pulverized one, or a granular shape produced by a granular production method in which a degree of dispersion and a fluidity are appropriately adjusted by a centrifugal milling method, a hot-cut method, or the like.

It is preferable that the resin composition of the present embodiment is produced by the following procedure:
first, only the epoxy resin (A) and the rubber particles (D) are mixed to obtain a masterbatch, and
subsequently, the masterbatch is mixed with other components (the curing agent (B), the inorganic filler (C), and the like).

By adopting such a production method, the dispersibility of the rubber particles (D) in the sealing resin composition is highly uniform, and the toughness index, and the strength and the elastic modulus of the cured product can be within desired ranges.

The resin composition of the present embodiment obtained by the method has a toughness index at 25° C. is equal to or more than 80 and equal to or less than 100.

In addition, the bending elastic modulus of a cured product of the resin composition of the present embodiment obtained by the method at 25° C. is, for example, equal to or less than 12,000 MPa, and preferably equal to or less than 11,000 MPa. The lower limit value of the bending elastic modulus of the cured product of the resin composition of the present embodiment at 25° C. is, for example, equal to or more than 9,000 MPa.

In addition, the bending strength of the cured product of the resin composition of the present embodiment at 25° C. is, for example, equal to or more than 95 MPa, and preferably equal to or more than 98 MPa. The upper limit value of the bending strength of the cured product of the resin composition at 25° C. is, for example, equal to or less than 120 MPa.

The toughness index of the cured product of the resin composition of the present embodiment at 260° C. is, for example, equal to or more than 100 and equal to or less than 160. In addition, the bending elastic modulus of the cured product of the resin composition of the present embodiment at 260° C. is, for example, equal to or less than 3,000 MPa, and preferably equal to or less than 2,500 MPa. The lower limit value of the bending elastic modulus of the cured product of the resin composition of the present embodiment at 260° C. is, for example, equal to or more than 1,000 MPa.

In addition, the bending strength of the cured product of the resin composition of the present embodiment at 260° C. is, for example, equal to or more than 20 MPa, and preferably equal to or more than 25 MPa. The upper limit value of the bending strength of the cured product of the resin composition at 260° C. is, for example, equal to or less than 40 MPa.

By preparing the resin composition of the present embodiment using the above-described components in specific blending amounts or using a specific method, in particular, a high strength and a low elasticity of a cured product at room temperature are achieved, and as a result, a high toughness is achieved.

[Use]

The resin composition of the present embodiment is suitably used for sealing a semiconductor device. In particular, the resin composition of the present embodiment is suitably used as a sealing material for a power device due to its excellent toughness.

The embodiments of the present invention have been described above, but these are examples of the present invention and various configurations other than those can be adopted.

EXAMPLES

Hereinafter, the present invention will be described with reference to Examples and Comparative Examples, but the present invention is not limited thereto.

Examples 1 to 6 and Comparative Examples 1 to 3

(Preparation of Sealing Resin Composition)

The amount (parts by weight) of each component shown in Table 1 was mixed at normal temperature using a Henschel mixer to obtain a mixture. Then, the mixture was roll-kneaded at 70° C. to 100° C. to obtain a kneaded product. The kneaded product thus obtained was cooled and then pulverized to obtain a sealing resin composition.

The amount ratio (parts by mass) of each component is as described in Table 1. In addition, the details of the components listed in Table 1 are provided below.

(Epoxy Resin)
  Epoxy resin 1: Triphenol methane-type epoxy resin (1032H60 manufactured by Mitsubishi Chemical Corporation)
  Epoxy resin 2: Orthocresol novolac-type epoxy resin (EOCN-1020-55 manufactured by Nippon Kayaku Co., Ltd.)

(Curing Agent)
  Curing agent 1: Triphenol methane-type phenol resin, (MEH-7500 manufactured by Meiwa Plastic Industries, Ltd.)
  Curing agent 2: Novolac-type phenol resin (PR-HF-3 manufactured by Sumitomo Bakelite Co., Ltd.)

(Rubber Particles)
  Rubber particles 1: Core-shell rubber (butadiene-based rubber) (S-2030 manufactured by Mitsubishi Chemical Corporation)
  Rubber particles 2: Core-shell rubber (acrylic rubber) (AC-3832 SD manufactured by Aika Kogyo Co., Ltd.)
  Rubber particles 3: Core-shell rubber (acrylic rubber) (AC-4030 manufactured by Aika Kogyo Co., Ltd.)
  Rubber particles 4: Core-shell rubber (core: butadiene-based rubber, shell: acrylic rubber) (EXL-2655 manufactured by Dow Chemical Co., Ltd.)

Rubber particles 5: Core-shell rubber (core: butadiene-based rubber, shell: acrylic rubber) (TMS-2670J manufactured by Dow Chemical Co., Ltd.)

Rubber particles 6: Silicone rubber (CF-2152 manufactured by Dow Corning Toray Co., Ltd.)

(Inorganic Filler)

Inorganic filler 1: Fused spherical silica (FB-105 manufactured by Denka Co., Ltd.)

Inorganic filler 2: Fused spherical silica (SC-2500-SQ manufactured by Admatechs Co., Ltd.)

Inorganic filler 3: Fused spherical silica (SC-5500-SQ manufactured by Admatechs Co., Ltd.)

(Curing Accelerator)

Curing accelerator 1: Tetraphenylphosphonium 4,4'-sulfonyldiphenolate

Curing accelerator 2: 2,3-Dihydroxynaphthalene (Colorant)

Colorant 1: Carbon black, (Carbon #5 manufactured by Mitsubishi Chemical Corporation)

(Coupling Agent)

Coupling agent 1: N-Phenyl-3-aminopropyltrimethoxysilane (CF-4083 manufactured by Dow Corning Toray Co., Ltd.)

(Mold Release Agent)

Mold release agent 1: Polyethylene oxide wax (LICO-WAX PED191 manufactured by Clariant Japan K. K.)

(Low Stress Agent)

Low stress agent 1: Epoxy·polyether-modified silicone oil (FZ-3730 manufactured by Dow Corning Toray Co., Ltd.)

Low stress agent 2: Silicone resin (KR-480 manufactured by Shin-Etsu Chemical Co., Ltd.)

(Evaluation of Physical Properties of Sealing Resin Composition)

The following physical properties were measured for the sealing resin composition obtained in each of Examples and each of Comparative Examples. The results are shown in Table 1.

(Spiral Flow)

A spiral flow test was performed using the resin compositions obtained in each of the examples.

For the test, with a low-pressure transfer molding machine ("KTS-15" manufactured by KOHTAKI Corporation), the resin molding material was injected into a mold for measuring a spiral flow according to EMMI-1-66 under conditions of a mold temperature of 175° C., an injection pressure of 6.9 MPa, and a curing time of 120 seconds, thereby measuring a flow length.

(Gel Time)

A gel time of the resin composition obtained in each of the examples was measured. Measurement of the gel time was carried out by melting the resin composition over a hot plate that has been heated to 120° C. and then measuring the time taken to cure (gel time: seconds) while kneading with a spatula.

(Bending Elastic Modulus)

After performing a transfer molding at 180° C./3 minutes, the resin composition was further cured at 180° C./4 hours to measure a bending elastic modulus at 25° C. and 260° C. in accordance with JIS6911.

(Bending Strength)

A cured product was created in the same manner as in the above-described measurement of the bending elastic modulus, and bending strengths at 25° C. and 260° C. were measured in accordance with JIS6911.

(Toughness Index)

The toughness indices at 25° C. and 260° C. were calculated from the following equation.

Toughness index=Bending strength/Bending elastic modulus×10,000

TABLE 1

| | | Unit | Example 1 | Example 2 | Example 3 | Example 4 | Example 5 |
|---|---|---|---|---|---|---|---|
| <Formulation of resin composition> | | | | | | | |
| Epoxy resin | Epoxy resin 1 | % by mass | 9.53 | 9.53 | 9.53 | 9.53 | 9.53 |
| | Epoxy resin 2 | % by mass | — | — | — | — | — |
| Curing agent | Curing agent 1 | % by mass | 4.85 | 4.85 | 4.85 | 4.85 | 4.85 |
| | Curing agent 2 | % by mass | — | — | — | — | — |
| Rubber particles | Rubber particle 1 | % by mass | 3.00 | — | — | — | — |
| | Rubber particle 2 | % by mass | — | 3.00 | — | — | — |
| | Rubber particle 3 | % by mass | — | — | 3.00 | — | — |
| | Rubber particle 4 | % by mass | — | — | — | 3.00 | — |
| | Rubber particle 5 | % by mass | — | — | — | — | 3.00 |
| | Rubber particle 6 | % by mass | — | — | — | — | — |
| Inorganic filler | Inorganic filler 1 | % by mass | 61.30 | 61.30 | 61.30 | 61.30 | 61.30 |
| | Inorganic filler 2 | % by mass | 10.00 | 10.00 | 10.00 | 10.00 | 10.00 |
| | Inorganic filler 3 | % by mass | 10.00 | 10.00 | 10.00 | 10.00 | 10.00 |
| Curing accelerator | Curing accelerator 1 | % by mass | 0.19 | 0.19 | 0.19 | 0.19 | 0.19 |
| | Curing accelerator 2 | % by mass | 0.13 | 0.13 | 0.13 | 0.13 | 0.13 |
| Colorant | Colorant 1 | % by mass | 0.30 | 0.30 | 0.30 | 0.30 | 0.30 |
| Coupling agent | Coupling agent 1 | % by mass | 0.30 | 0.30 | 0.30 | 0.30 | 0.30 |
| Mold release agent | Mold release agent 1 | % by mass | 0.20 | 0.20 | 0.20 | 0.20 | 0.20 |
| Low stress agent | Low stress agent 1 | % by mass | 0.20 | 0.20 | 0.20 | 0.20 | 0.20 |
| | Low stress agent 2 | % by mass | — | — | — | — | — |

TABLE 1-continued

<Physical properties of resin composition>

| | Unit | | | | | |
|---|---|---|---|---|---|---|
| Spiral flow | cm | 45 | 79 | 83 | 63 | 79 |
| Gel time | sec | 51 | 54 | 55 | 47 | 46 |
| Bending strength (25° C.) | MPa | 92 | 109 | 100 | 95 | 96 |
| Bending elastic modulus (25° C.) | MPa | 10,600 | 12,400 | 11,500 | 10,600 | 10,200 |
| Toughness index (25° C.) | — | 86 | 88 | 87 | 90 | 94 |
| Bending strength (260° C.) | MPa | 23 | 29 | 27 | 24 | 23 |
| Bending elastic modulus (260° C.) | MPa | 1,800 | 2,700 | 2,400 | 1,900 | 1,900 |
| Toughness index (260° C.) | — | 130 | 109 | 111 | 128 | 122 |

| | | Unit | Example 6 | Comparative Example 1 | Comparative Example 2 | Comparative Example 3 |
|---|---|---|---|---|---|---|
| <Formulation of resin composition> | | | | | | |
| Epoxy resin | Epoxy resin 1 | % by mass | — | 11.50 | 9.53 | 9.53 |
| | Epoxy resin 2 | % by mass | 9.78 | — | — | — |
| Curing agent | Curing agent 1 | % by mass | — | 5.84 | 4.85 | 4.85 |
| | Curing agent 2 | % by mass | 4.60 | — | — | — |
| Rubber particles | Rubber particle 1 | % by mass | — | — | — | — |
| | Rubber particle 2 | % by mass | — | — | — | — |
| | Rubber particle 3 | % by mass | — | — | — | — |
| | Rubber particle 4 | % by mass | — | — | — | — |
| | Rubber particle 5 | % by mass | 3.00 | — | — | — |
| | Rubber particle 6 | % by mass | — | — | 3.00 | — |
| Inorganic filler | Inorganic filler 1 | % by mass | 61.30 | 61.30 | 61.30 | 61.30 |
| | Inorganic filler 2 | % by mass | 10.00 | 10.00 | 10.00 | 10.00 |
| | Inorganic filler 3 | % by mass | 10.00 | 10.00 | 10.00 | 10.00 |
| Curing accelerator | Curing accelerator 1 | % by mass | 0.19 | 0.23 | 0.19 | 0.19 |
| | Curing accelerator 2 | % by mass | 0.13 | 0.13 | 0.13 | 0.13 |
| Colorant | Colorant 1 | % by mass | 0.30 | 0.30 | 0.30 | 0.30 |
| Coupling agent | Coupling agent 1 | % by mass | 0.30 | 0.30 | 0.30 | 0.30 |
| Mold release agent | Mold release agent 1 | % by mass | 0.20 | 0.20 | 0.20 | 0.20 |
| Low stress agent | Low stress agent 1 | % by mass | 0.20 | 0.20 | 0.20 | 0.20 |
| | Low stress agent 2 | % by mass | — | — | — | 3.00 |
| <Physical properties of resin composition> | | | | | | |
| Spiral flow | | cm | 115 | 83 | 83 | 107 |
| Gel time | | sec | 50 | 46 | 46 | 48 |
| Bending strength (25° C.) | | MPa | 100 | 120 | 86 | 96 |
| Bending elastic modulus (25° C.) | | MPa | 10,300 | 17,000 | 14,800 | 14,000 |
| Toughness index (25° C.) | | — | 97 | 71 | 58 | 68 |
| Bending strength (260° C.) | | MPa | 20 | 23 | 23 | 26 |
| Bending elastic modulus (260° C.) | | MPa | 1,300 | 2,900 | 2,800 | 2,900 |
| Toughness index (260° C.) | | — | 154 | 79 | 82 | 90 |

Any of the resin compositions of each of the examples can be used as a sealing material, and particularly, the resin compositions of Examples had a toughness index of a cured product thereof at 25° C. in a predetermined range, and had both a low elasticity and a high strength.

This application claims priority based on Japanese Patent Application No. 2021-089965 filed on May 28, 2021, the entire disclosure of which is herein incorporated by reference.

The invention claimed is:

1. A sealing resin composition comprising:
an epoxy resin;
a curing agent;
an inorganic filler; and
rubber particles,
wherein the rubber particles include core-shell-type rubber particles;
wherein a toughness index of a cured product of the sealing resin composition at 25° C. calculated from the following equation is equal to or more than 80 and equal to or less than 100;

Toughness index=Bending strength/Bending elastic modulus×10,000;

wherein a bending elastic modulus of the cured product of the sealing resin composition at 25° C. is equal to or less than 12,000 MPa; and
wherein a bending strength of the cured product of the sealing resin composition at 25° C. is equal to or more than 95 MPa.

2. The sealing resin composition according to claim 1, wherein a toughness index of the cured product of the sealing resin composition at 260° C. is equal to or more than 100 and equal to or less than 160.

3. The sealing resin composition according to claim 1, wherein a bending elastic modulus of the cured product of the sealing resin composition at 260° C. is equal to or less than 3,000 MPa.

4. The sealing resin composition according to claim 1, wherein a bending strength of the cured product of the sealing resin composition at 260° C. is equal to or more than 20 MPa.

5. The sealing resin composition according to claim 1, wherein a glass transition temperature of the sealing resin composition is equal to or higher than 150° C. and equal to or lower than 270° C.

6. The sealing resin composition according to claim 1, wherein an average particle diameter of primary particles of the rubber particles is equal to or more than 10 nm and equal to or less than 500 nm.

7. The sealing resin composition according to claim 1, wherein a core layer of the core-shell-type rubber particles includes at least one selected from a diene-based rubber, an acrylic rubber, and a polysiloxane-based rubber.

8. The sealing resin composition according to claim 1, wherein a shell layer of the core-shell-type rubber particles includes at least one selected from a diene-based rubber, an acrylic rubber, and a polysiloxane-based rubber.

9. The sealing resin composition according to claim 1, wherein an amount of the rubber particles is equal to or more than 0.1% by mass and equal to or less than 10% by mass with respect to a total solid content of the sealing resin composition.

10. The sealing resin composition according to claim 1, wherein the epoxy resin is at least one selected from a bisphenol F-type epoxy resin, a bisphenol A-type epoxy resin, a phenol novolac-type epoxy resin, a cresol novolac-type epoxy resin, a naphthalene-type epoxy resin, and a biphenyl-type epoxy resin.

11. The sealing resin composition according to claim 1, wherein the inorganic filler is at least one selected from silica, talc, alumina, titanium white, aluminum nitride, aluminum hydroxide, magnesium hydroxide, zinc borate, zinc molybdate, and silicon nitride.

12. The sealing resin composition according to claim 1, further comprising a curing accelerator.

13. The sealing resin composition according to claim 1, wherein the sealing resin composition is used for sealing a power semiconductor.

14. A method for producing the sealing resin composition according to claim 1, the method comprising:
a step of mixing the epoxy resin and the rubber particles to obtain a masterbatch; and
a step of mixing the obtained masterbatch, the curing agent, and the inorganic filler to obtain the resin composition.

* * * * *